(12) United States Patent
Huang et al.

(10) Patent No.: US 9,564,886 B2
(45) Date of Patent: Feb. 7, 2017

(54) CIRCUIT AND METHOD FOR CONTROLLING OPERATION VOLTAGE, AND STORAGE DEVICE

(71) Applicant: Shanghai Huahong Grace Semiconductor Manufacturing Corporation, Shanghai (CN)

(72) Inventors: Mingyong Huang, Shanghai (CN); Jun Xiao, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/978,484

(22) Filed: Dec. 22, 2015

(65) Prior Publication Data

US 2016/0191043 A1 Jun. 30, 2016

(30) Foreign Application Priority Data

Dec. 30, 2014 (CN) .......................... 2014 1 0857352

(51) Int. Cl.
*G05F 1/10* (2006.01)
*H03K 5/24* (2006.01)
*H02M 3/07* (2006.01)

(52) U.S. Cl.
CPC *H03K 5/24* (2013.01); *H02M 3/07* (2013.01)

(58) Field of Classification Search
None
See application file for complete search history.

(56) References Cited

U.S. PATENT DOCUMENTS 7,414,890 B2 8/2008 Byeon et al.
8,223,530 B2 7/2012 Kitagawa
(Continued)

FOREIGN PATENT DOCUMENTS

CN 101154463 A 4/2008
CN 101833930 A 9/2010
(Continued)

OTHER PUBLICATIONS

First Chinese Office Action regarding Application No. 201410857352.9 dated Oct. 10, 2015. English translation provided by Unitalen Attorneys at Law.

*Primary Examiner* — Cassandra Cox
(74) *Attorney, Agent, or Firm* — Harness, Dickey & Pierce, P.L.C.

(57) ABSTRACT

A circuit and a method for controlling operation voltage, and a storage device are provided. The circuit includes: a voltage boost unit adapted for: if receiving a first signal, performing a voltage boost process; and if receiving a second signal, stopping the voltage boost process; a voltage division unit including a plurality of different voltage division coefficients, adapted for performing a voltage division process; a comparison unit adapted for: comparing the divided voltage with a reference voltage; if the divided voltage is low, outputting the first signal; and if not, outputting the second signal; a control unit adapted for performing a descending switching operation on the voltage division coefficients; and an output unit. The establishing speed of the operation voltage is effectively controlled, and an effect on device power consumption and performance caused by the threshold voltage and variations of the threshold voltage in the working process is eliminated.

17 Claims, 3 Drawing Sheets

(56) References Cited

U.S. PATENT DOCUMENTS

| | | |
|---|---|---|
| 2008/0123417 A1 | 5/2008 | Byeon et al. |
| 2009/0115500 A1* | 5/2009 | Kuwagata .............. G11C 5/143 |
| | | 327/538 |
| 2009/0160411 A1 | 6/2009 | Tran et al. |
| 2010/0271861 A1 | 10/2010 | Kitagawa |
| 2011/0084675 A1* | 4/2011 | Kawagoshi ............. H02M 3/07 |
| | | 323/282 |
| 2013/0241515 A1* | 9/2013 | Yamashiro ............. G05F 1/625 |
| | | 323/284 |
| 2013/0307504 A1 | 11/2013 | Sato |
| 2014/0111271 A1* | 4/2014 | Fujisawa ................ G11C 5/145 |
| | | 327/536 |
| 2015/0194878 A1 | 7/2015 | Hu et al. |

FOREIGN PATENT DOCUMENTS

| | | |
|---|---|---|
| CN | 101872643 A | 10/2010 |
| CN | 102938610 A | 2/2013 |
| CN | 103780256 A | 5/2014 |

* cited by examiner

CIRCUIT AND METHOD FOR CONTROLLING OPERATION VOLTAGE, AND STORAGE DEVICE

CROSS-REFERENCE TO RELATED APPLICATIONS

The present application claims priority to Chinese patent application No. 201410857352.9, filed on Dec. 30, 2014, and entitled "CIRCUIT AND METHOD FOR CONTROLLING OPERATION VOLTAGE, AND STORAGE DEVICE", the entire disclosure of which is incorporated herein by reference.

TECHNICAL FIELD

The present disclosure generally relates to semiconductor storage technology, and more particularly, to a circuit for controlling operation voltage, a method for controlling operation voltage, and a storage device.

BACKGROUND

Nowadays, in the rapid development of semiconductor storage device, DRAM, EEPROM, FLASH and other advanced storage devices have been widely used in computers and mobile communication terminals, attributed to their advantages such as high density, low power consumption and low price. Due to the requirements of low power consumption and low cost, a power supply of the storage device always has a low voltage, such as 2.5V, 1.8V, etc. However, in order to implement "write", "erase" and other operations of information, a programming voltage and an erase voltage which are much higher than the power supply voltage are always required, such as 8V, 12V, etc. Therefore, a charge pump circuit is widely used in the storage device. The charge pump circuit is used to obtain higher operation voltages for the storage device from the lower power supply voltage, such as the programming voltage, the erase voltage, etc.

If the higher operation voltage is established and applied to the storage device too fast, the storage device may be damaged and reliability of the storage device may be reduced. In order to prevent the above situation, an establishment speed of the operation voltage should be controlled. Hence, in the conventional Flash, a control circuit is always configured to control boost speed of the operation voltage.

A structure diagram of a conventional circuit for controlling erase voltage of Flash is illustrated in FIG. 1. The circuit includes:

a charge pump 11 adapted for output a high voltage HVE;

a mirroring constant current source 12 which includes a first PMOS transistor P1, a second PMOS transistor P2, a switch K and a current source $I_{bias}$, where a drain of the first PMOS transistor P1, a gate of the first PMOS transistor P1, a gate of the second PMOS transistor P2 and a first terminal of the switch K are connected together, a second terminal of the switch K is connected with a first terminal of the current source $I_{bias}$, and a second terminal of the current source $I_{bias}$ is connected with ground;

a capacitor, where a first terminal of the capacitor is connected with ground; and an NMOS transistor N, where a source of the NMOS transistor, a source of the first PMOS transistor P1, a source of the second PMOS transistor P2 and an output terminal of the charge pump 11 are connected together, a gate of the second NMOS transistor N2, a drain of the second PMOS transistor P2 and a second terminal of the capacitor C are connected together, and a drain of the NMOS transistor N is adapted for outputting an erase voltage VEP.

FIG. 2 illustrates a boost process of the erase voltage in FIG. 1. As shown in FIG. 2, the high voltage HVE is quickly generated and established by the charge pump 11; when the switch K is closed, the NMOS transistor N is turned on, and the capacitor C is charged; a drain voltage Gramp of the second PMOS transistor P2 is boosted continuously, and the erase voltage VEP is also boosted along with the drain voltage Gramp. Thus, the erase voltage VEP can be slowly established by controlling the boost speed of the drain voltage Gramp.

It can be seen from the circuit shown FIG. 1 that, VEP=Gramp−Vth1 and Gramp=HVE−Vth2, where Vth1 is the threshold voltage of the NMOS transistor N, and Vth2 is the threshold voltage of the second PMOS transistor P2.

However, the above circuit has the following disadvantages:

1) the charge pump 11 needs to generate a voltage HVE which is higher than the erase voltage VEP, so that the power consumption of the circuit is increased, and performance requirements of electric devices in the circuit are also increased;

2) in the working process (for example, after a plurality of erase operations are performed), threshold voltage Vth1 of the NMOS transistor N may be changed, so that the erase voltage VEP may deviate from a target value, and the performance of the device are affected.

SUMMARY

In order to solve the above problem, a circuit for controlling operation voltage, a method for controlling operation voltage, and a storage device are provided in embodiments of the present disclosure. On a basis that the establishing speed of the operation voltage is effectively controlled, an effect on device power consumption and performance caused by the threshold voltage and variations of the threshold voltage in the working process is eliminated.

In order to solve the above problem, a circuit for controlling operation voltage is provided in embodiments of the present disclosure. In one embodiment, the circuit may include:

a voltage boost unit adapted for: if receiving a first signal, performing a voltage boost process so as to output a boosted voltage; and if receiving a second signal, stopping the voltage boost process and maintaining a value of the boosted voltage;

a voltage division unit adapted for performing a voltage division process on the boosted voltage so as to output a divided voltage, wherein the voltage division unit includes a plurality of different voltage division coefficients;

a comparison unit adapted for: comparing the divided voltage with a reference voltage; if the divided voltage is lower than the reference voltage, outputting the first signal; and if the divided voltage is higher than the reference voltage, outputting the second signal;

a control unit adapted for performing a descending switching operation on at least parts of the plurality of voltage division coefficients until the boosted voltage reaches a target voltage; and an output unit adapted for outputting the boosted voltage.

In some embodiments, the voltage boost unit may be a charge pump.

In some embodiments, the voltage division unit may be implemented in a resistor division mode, a capacitance division mode, or a transistor division mode.

In some embodiments, the voltage division unit may include a plurality of output terminals, a number of the plurality of output terminals is equal to a number of the plurality of voltage division coefficients, and the plurality of output terminals are corresponding to the plurality of voltage division coefficients respectively.

In some embodiments, the control unit may includes a plurality of control subunits, a number of the plurality of control subunits is equal to the number of the plurality of voltage division coefficients, each of the plurality of control subunits includes a clock pulse generation unit and a switch, a first terminal of the switch is connected with an output terminal of the voltage division unit, a second terminal of the switch is connected with an input terminal of the voltage division unit, and the clock pulse generation unit is adapted for generating a clock pulse signal to control the switch to be turned on or off.

In some embodiments, the switch may be an NMOS transistor, a source of the NMOS transistor is connected with the voltage division unit, a drain of the NMOS transistor is connected with the comparison unit, and a gate of the NMOS transistor is connected with the clock pulse generation unit.

In some embodiments, the clock pulse generation unit may include a decoding circuit and a NOR gate, the decoding unit is connected with a first input terminal of the NOR gate, a second input terminal of the NOR gate is adapted for receiving a low level signal, and an output terminal of the NOR gate is connected with the switch.

In some embodiments, the first signal may be a high level signal, and the second signal may be a low level signal.

In order to solve the above problem, a storage device is also provided in embodiments of the present disclosure. The storage device may include the circuit described above.

In order to solve the above problem, a method for controlling operation voltage is also provided in embodiments of the present disclosure. In one embodiment, the method may include:

providing an initial voltage, and performing a voltage boost process on the initial voltage so as to obtain a boosted voltage;

performing a voltage division process on the boosted voltage so as to obtain a divided voltage;

if the divided voltage is lower than a reference voltage, performing the voltage boost process continuously, and if the divided voltage is higher than the reference voltage, stopping the voltage boost process;

performing a switching process, where the switch process includes: after the voltage boost process is stopped for a period of time, reducing a voltage division coefficient of the voltage boost process, such that the divided voltage is lower than the reference voltage and the voltage boost process is performed until the divided voltage is higher than the reference voltage and the voltage boost process is stopped; and repeating the switching process until the boosted voltage reaches a target voltage.

Compared with the conventional technology, embodiments of the present disclosure have following advantages. In the voltage boost process and the voltage division process, the divided voltage is compared with the reference voltage continuously so as to determine whether the voltage boost process should be stopped; and after the voltage boost process is stopped for a period of time, by reducing the voltage division coefficient of the voltage division process, the voltage boost process is performed again until the boosted voltage reaches the target voltage. Hence, the boost process is divided into multiple steps, and each step includes a boost process and a maintaining process (that is, the voltage boost process is stopped). Therefore, the boost speed of the operation voltage is effectively controlled. Meanwhile, the boosted voltage is equal to the operation voltage, such that an effect on device power consumption and performance caused by the threshold voltage and variations of the threshold voltage in the working process is eliminated.

DETAILED DESCRIPTION

As described above, in order to control the boost speed of the erase voltage, the boost speed of the boosted voltage is controlled in the prior art. However, the erase voltage is lower than the boosted voltage, the difference between them is equal to a threshold voltage, and the threshold voltage is very unstable. Hence, the power consumption of the circuit is increased and the performance of the circuit is degraded.

In order to solve the above problem, a circuit and a method for controlling operation voltage, and a storage device are provided in embodiments of the present disclosure. By adding a voltage division process, a comparison process and a switch process after a voltage boost process, a boost process of the boosted voltage is divided into multiple steps. In each step, after being boosted to a certain value, the boosted voltage may be maintained at the value for a period, such that the boost speed of the operation voltage is effectively controlled. On the basis that the establishing speed of the operation voltage is effectively controlled, the boosted voltage is the operation voltage, that is, the boosted voltage is equal to the operation voltage. Then, a negative effect on device power consumption and performance, which is caused by threshold voltage variations in the working process, is eliminated.

In order to clarify the objects, characteristics and advantages of the disclosure, the embodiments of the present disclosure will be described in detail in conjunction with the accompanying drawings.

Figure 1:
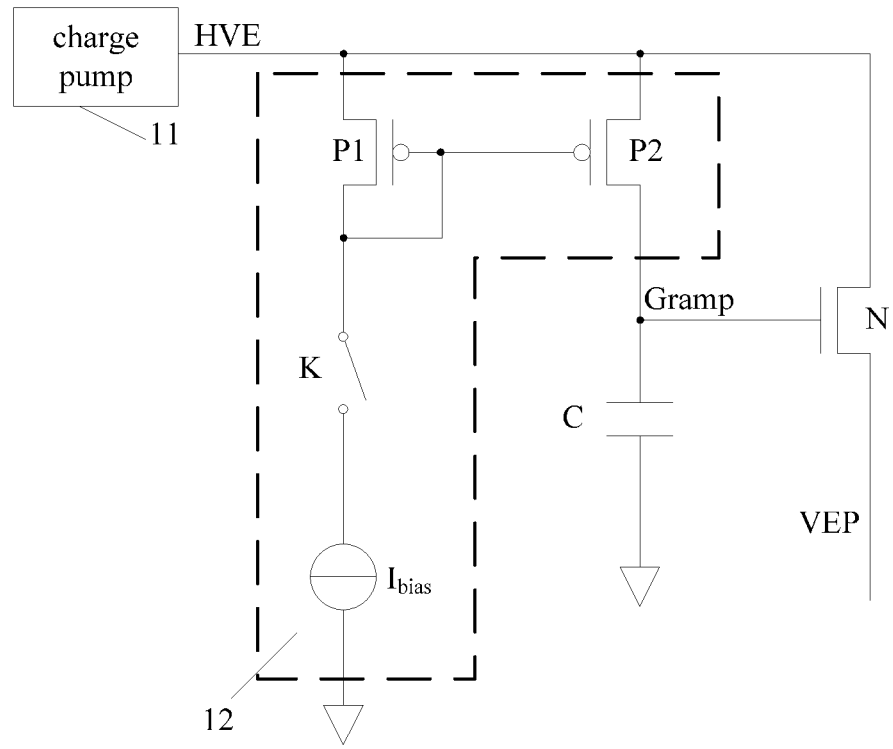
FIG. 1 schematically illustrates a structure diagram of a conventional circuit for controlling erase voltage of Flash.
Figure 2:
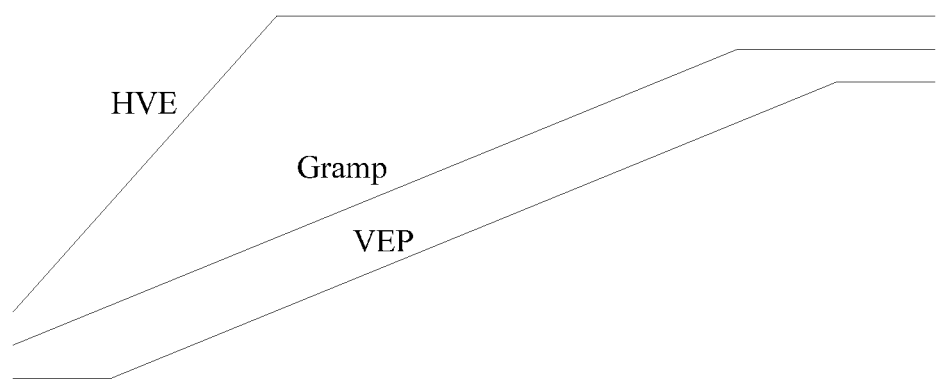
FIG. 2 schematically illustrates a diagram of a boost process of the erase voltage in FIG. 1.
Figure 3:
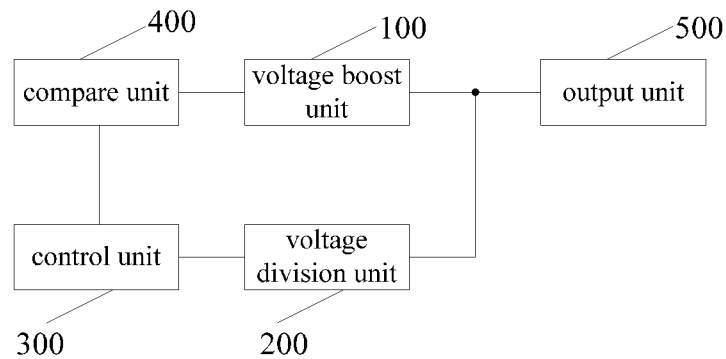
FIG. 3 schematically illustrates a block diagram of a circuit for controlling operation voltage according to one embodiment of the present disclosure.

Referring to FIG. 3, a circuit for controlling operation voltage is provided in one embodiment of the present disclosure. The circuit may include:

a voltage boost unit 100 adapted for: if receiving a first signal, performing a voltage boost process so as to output a boosted voltage; and if receiving a second signal, stopping the voltage boost process and maintaining a value of the boosted voltage;

a voltage division unit 200 adapted for performing a voltage division process on the boosted voltage so as to output a divided voltage, wherein the voltage division unit 200 includes a plurality of different voltage division coefficients;

a comparison unit 400 adapted for: comparing the divided voltage with a reference voltage; if the divided voltage is lower than the reference voltage, outputting the first signal; and if the divided voltage is higher than the reference voltage, outputting the second signal;

a control unit 300 adapted for performing a descending switching operation on at least parts of the plurality of voltage division coefficients until the boosted voltage reaches a target voltage; and an output unit 500 adapted for outputting the boosted voltage.

In this embodiment, the voltage boost unit 100 may be a charge pump of any type, which can perform a voltage boost process on an initial voltage (for example, a power supply voltage) and output a boosted voltage.

The output unit 500 is connected with an output terminal of the voltage boost unit 100 and is adapted for outputting the boosted voltage.

The voltage division unit 200 is connected with an output terminal of the voltage boost unit 100, and is adapted for performing a voltage division process on the received boosted voltage, so as to output a divided voltage. That is, V2=(n/m)V1, where V2 stands for the divided voltage, V1 stands for the boosted voltage, both n and m are positive integers, n is less than or equal to m, and n/m stands for a voltage division coefficient (namely, a ratio of the divided voltage V2 and the boosted voltage V1).

In this embodiment, the voltage division unit 200 includes a plurality of different voltage division coefficients, so as to perform a plurality of different voltage division processes. For example, the voltage division coefficients may be 1, ⅚, ⅔, ½, ⅓, ¼, ⅕, ⅙ . . . 1/12, etc, so as to output different divided voltages.

The voltage division unit 200 may work in a resistor division mode, a capacitance division mode, or a transistor division mode, which is not limited herein.

Specifically, the voltage division unit 200 may includes a plurality of output terminals. A number of the plurality of output terminals is equal to a number of the plurality of voltage division coefficients, and each output terminal corresponds to a different voltage division coefficient.

The number of the plurality of voltage division coefficients is an integer greater than or equal to 2, and determines how many steps a voltage boost process is divided into subsequently. The larger the number is, the more effective the boost speed of the boosted voltage is controlled.

The control unit 300 may include a plurality of control subunits. A number of the plurality of control subunits is equal to the number of the plurality of voltage division coefficients. Each control subunit may include: a clock pulse generation unit and a switch. A first terminal of the switch is connected with an output terminal of the voltage division unit, and a second terminal of the switch is connected with an input terminal of the voltage division unit. The clock pulse generation unit is adapted to generate a clock pulse signal for controlling the switch to be turned on or off, so as to realize the switch control of the plurality of voltage division coefficients and make the boosted voltage being equal to a target voltage.

A value of the target voltage is equal to a value of a required operation voltage (for example, an erase voltage).

The switch may be an NMOS transistor, where a source of the NMOS transistor is connected with the voltage division unit, a drain of the NMOS transistor is connected with the comparison unit, and a gate of the NMOS transistor is connected with the clock pulse generation unit.

It should be noted that, in other embodiments, the switch may be other kinds of components.

The clock pulse generation unit may include: a decoding circuit and a NOR gate, where a first input terminal of the NOR gate is connected with the decoding circuit, a second input terminal of the NOR gate is adapted for receiving a low level signal, and an output terminal of the NOR gate is connected with the gate of the NMOS transistor.

Specifically, the decoding circuit may include a clock circuit and a frequency division circuit. The specific implementation of the decoding circuit is well known to those skilled in the art, and is not described in detail herein.

In this embodiment, different clock circuits and frequency division circuits can be used to output clock pulses of different waveforms, so as to control parameters of the boost voltage, such as a rising rate, a rising time, etc.

The comparison unit 400 may include a first input terminal, a second input terminal and an output terminal, where the first input terminal is adapted for receiving a reference voltage, the second input terminal is connected with the output terminal of the control unit, and the output terminal is connected with the input terminal of the voltage boost unit.

In this embodiment, for the comparison unit 400, when a voltage of the second input terminal is greater than a voltage of the first input terminal, the output terminal outputs a high level signal to the voltage boost unit, such that the comparison unit 400 performs the voltage boost process (namely, the first signal is a high level signal); when the voltage of the second input terminal is less than the voltage of the first input terminal, the output terminal outputs a low level signal to the voltage boost unit, such that the voltage boost unit stops the voltage boost process (namely, the second signal is a low level signal).

It should be noted that, in other embodiments, the first signal may be a low level signal and the second signal may be a high level signal.

The reference voltage may has a value lower than a value of a system voltage (for example, 1.5V), such as 0.9V, 1V, 1.2V, etc. The reference voltage may be generated by a reference voltage generation unit (not shown in FIG. 3). The lower the value of the reference voltage is, the more accurate the control of the operation voltage is.

Figure 4:
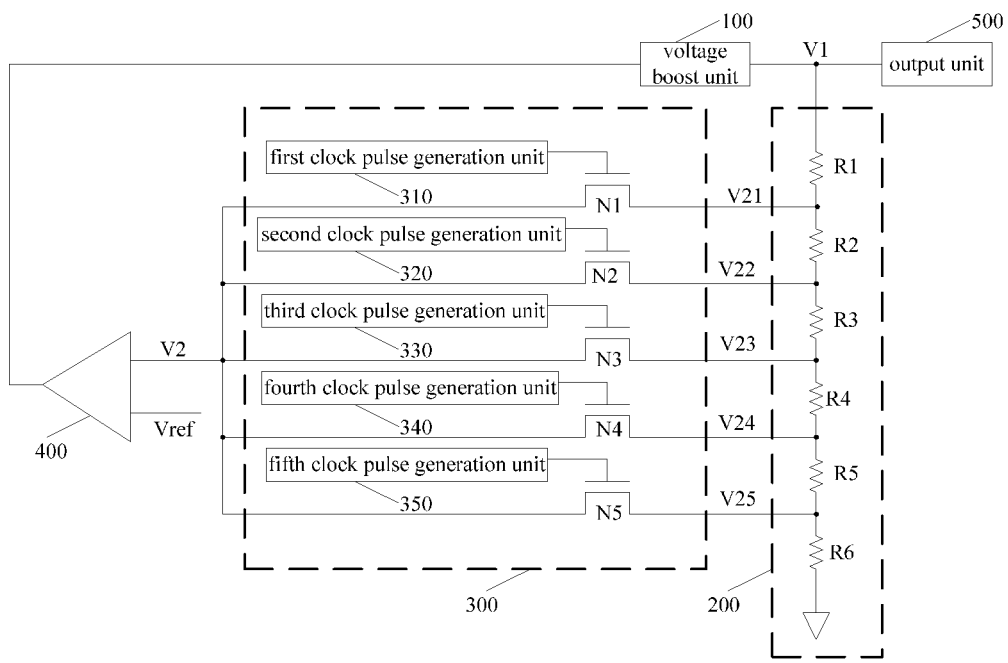
FIG. 4 schematically illustrates a structure diagram of a circuit for controlling operation voltage according to one embodiment of the present disclosure.

Referring to FIG. 4, the resistor division mode is taken as an example in this embodiment. The voltage division unit 200 may include six resistors connected in series, which are a first resistor R1, a second resistor R2, a third resistor R3, a fourth resistor R4, a fifth resistor R5 and a sixth resistor R6, wherein a first terminal of the first resistor R1 is connected with the output terminal of the voltage boost unit 100 and the input terminal of the output terminal 500, a second terminal of the first resistor R1 is connected with a first terminal of the second resistor R2, a second terminal of the second resistor R2 is connected with a first terminal of the third resistor R3, a second terminal of the third resistor R3 is connected with a first terminal of the fourth resistor R4, a second terminal of the fourth resistor R4 is connected with a first terminal of the fifth resistor R5, a second terminal of the fifth resistor R5 is connected with a first terminal of the sixth resistor R6, and a second terminal of the sixth resistor R6 is connected with ground.

The control unit 300 may include: a first clock pulse generation unit 310, a first NMOS transistor N1, a second clock pulse generation unit 320, a second NMOS transistor N2, a third clock pulse generation unit 330, a third NMOS transistor N3, a fourth clock pulse generation unit 340, a fourth NMOS transistor N4, a fifth clock pulse generation unit 350 and a fifth NMOS transistor N5, wherein the first clock pulse generation unit 310 is connected with a gate of the first NMOS transistor N1, a source of the first NMOS N1 transistor is connected with the second terminal of the first resistor R1 and the first terminal of the second resistor R2, and a drain of the first NMOS transistor N1 is connected with the comparison unit 400; the second clock pulse generation unit 320 is connected with the a gate of the second NMOS transistor N2, a source of the second NMOS transistor N2 is connected with the second terminal of the second resistor R2 and the first terminal of the third resistor R3, and a drain of the second NMOS transistor N2 is connected with the comparison unit 400; the third clock pulse generation unit 330 is connected with a gate of the third NMOS transistor N3, a source of the third NMOS transistor N3 is connected with the second terminal of the third resistor R3 and the first terminal of the fourth resistor R4, and a drain of the third NMOS transistor N3 is connected with the comparison unit 400; the fourth clock pulse generation unit 340 is connected with a gate of the fourth NMOS transistor N4, a source of the fourth NMOS transistor N4 is connected with the second terminal of the fourth resistor R4 and the first terminal of the fifth resistor R5, and a drain of the fourth NMOS transistor N4 is connected with the comparison unit 400; and the fifth clock pulse generation unit 350 is connected with a gate of the fifth NMOS transistor N5, a source of the fifth NMOS transistor N5 is connected with the second terminal of the fifth resistor R5 and the first terminal of the sixth resistor R6, and a drain of the fifth NMOS transistor N5 is connected with the comparison unit 400.

The voltage division unit 200 shown in FIG. 3 includes five voltage division coefficients, such that it can output five different divided voltages. Namely, when the boosted voltage V1 is constant, the voltage division unit 200 may output a first divided voltage $V21=(1/6)V1$, a second divided voltage $V22=(2/6)V1$, a third divided voltage $V23=(3/6)V1$, a fourth divided voltage $V24=(4/6)V1$ and a fifth divided voltage $V25=(5/6)V1$, respectively.

Figure 5:
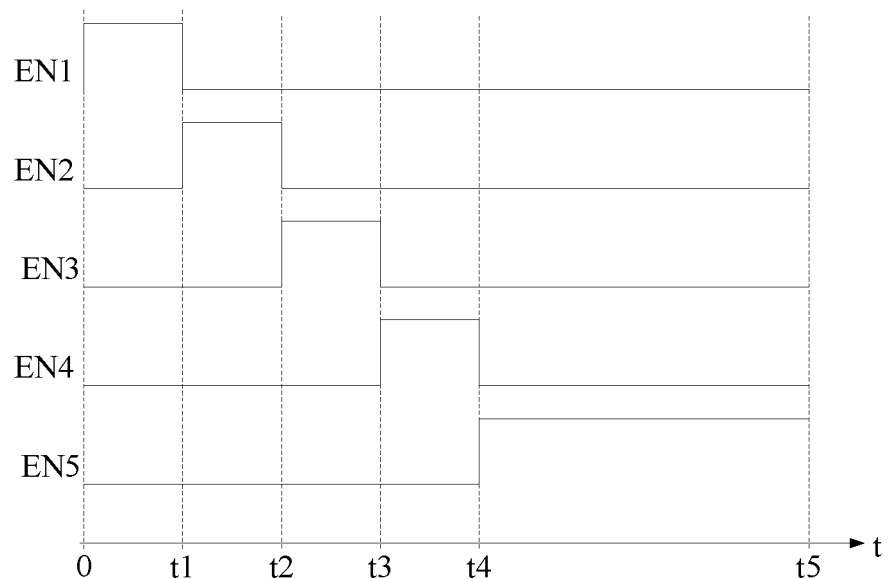
FIG. 5 schematically illustrates a timing diagram of five clock pulse signals according to one embodiment of the present disclosure.

FIG. 5 illustrates a timing diagram of clock pulse signals generated by the five clock pulse generation units shown in FIG. 4. As shown in FIG. 5, the first clock pulse generation unit 310 generates a first clock pulse signal EN1 which is at a high level in a time slot (0, t1) and is at a low level in the rest time; the second clock pulse generation unit 320 generates a second clock pulse signal EN2 which is at a high level in a time slot (t1, t2) and is at a low level in the rest time; the third clock pulse generation unit 330 generates a third clock pulse signal EN3 which is at a high level in a time slot (t2, t3) and is at a low level in the rest time; the fourth clock pulse generation unit 340 generates a fourth clock pulse signal EN4 which is at a high level in a time slot (t3, t4) and is at a low level in the rest time; and the fifth clock pulse generation unit 350 generates a fifth clock pulse signal EN5 which is at a high level in a time slot (t4, t5) and is at a low level in the rest time.

Referring to FIG. 4 and FIG. 5, when the reference voltage Vref is 1V and the target voltage is 6V, a working process of the control circuit will be described in detail hereunder.

1) In the time slot of (0, t1), the first clock pulse signal EN1 is at the high level, such that the first NMOS transistor N1 is turned on. At the same time, the rest four clock pulse signals are at the low level, such that the rest four NMOS transistors connecting to them are turned off. Therefore, the voltage division unit 200 outputs the first divided voltage V21. That is, the voltage division coefficient of the voltage division unit 200 is 5/6. In other words, by controlling the clock pulse signals generated by the clock pulse generation units, the control unit 300 can control these NMOS transistors to be turned on or off, so as to achieve a purpose of selecting a voltage division coefficient of the voltage division unit 200. Because the reference voltage Vref is 1V and the voltage division coefficient is 5/6, when the divided voltage V21 is lower than the reference voltage Vref (at this time, the boosted voltage V1 is lower than 1.2V), the comparison unit 400 outputs a high level signal, such that the boost unit 100 performs the voltage boost process continuously and boosts the boosted voltage V1 to a higher level. At the moment the boosted voltage V1 is boosted to be higher than 1.2V, the divided voltage V21 is higher than the reference voltage Vref, such that the comparison unit 400 outputs a low level signal, and then the boost unit 100 stops the voltage boost process and the boosted voltage V1 is maintained at 1.2V.

It should be noted that, the time slot of (0, t1) is longer than a time slot for boosting the boosted voltage V1 to 1.2V.

2) At the time of t1, the first clock pulse signal EN1 is switched to the low level, such that the first NMOS transistor N1 is turned off; the second clock pulse signal EN2 is switched to the high level, such that the second NMOS transistor N2 is turned on; and the rest three clock pulse signals are unchanged, such that the rest three NMOS transistors are still being turned off. Therefore, the voltage division unit 200 outputs the second divided voltage V22. That is, the voltage division coefficient of the voltage division unit 200 is 4/6. In other words, by controlling the clock pulse signals generated by the clock pulse generation units, the control unit 300 can control the corresponding NMOS transistors to be turned on or off, so as to achieve a purpose of switching the voltage division coefficient from 5/6 to 4/6. Because the voltage division coefficient is 4/6 and the boosted voltage V1 is 6/5V, the second divided voltage V22 is 4/5V at the moment. That is, the present divided voltage is lower than the reference voltage Vref. Therefore, the comparison unit 400 outputs the high level signal again, and then the boost unit 100 continues to perform the voltage boost process, so as to boost the boosted voltage V1 to a higher level on the basis of 1.2 V.

3) In the time slot of (t1, t2), all the clock pulse signals are unchanged, thus the boost unit 100 continuously performs the voltage process until the second divided voltage V22 reaches 1V. Namely, the boosted voltage reaches 1.5V. When the boosted voltage is greater than 1.5V, the second divided voltage V22 is greater than 1V, such that the comparison unit 400 changes to output the low level signal, and then the boost unit 100 stops the voltage boost process and the boosted voltage V1 is maintained at 1.5V.

It should be noted that, the time slot of (t2−t1) is longer than a time slot for boosting the boosted voltage V1 from 1.2V to 1.5V.

4) At the time of t2, the second clock pulse signal EN2 is switched to the low level, such that the second NMOS transistor N2 is turned off; the third clock pulse signal EN3 is switched to the high level, such that the third NMOS transistor N3 is turned on; and the rest three clock pulse signals are unchanged, such that the rest three NMOS transistors are still being turned off. Therefore, the voltage division unit 200 outputs the third divided voltage V23. That is, the voltage division coefficient of the voltage division unit 200 is $3/6$. In other words, by controlling the clock pulse signals generated by the clock pulse generation units, the control unit 300 can control the corresponding NMOS transistors to be turned on or off, so as to achieve a purpose of switching the voltage division coefficient from $4/6$ to $3/6$. Because the voltage division coefficient is $3/6$ and the boosted voltage V1 is 1.5V, the second divided voltage V22 is $4/8$V at the moment. That is, the present divided voltage is lower than the reference voltage Vref. Therefore, the comparison unit 400 outputs the high level signal again, and then the boost unit 100 continues to perform the voltage boost process, so as to boost the boosted voltage V1 to a higher level on the basis of 1.5 V.

5) In the time slot of (t2, t3), all the clock pulse signals are unchanged, thus the boost unit 100 continuously performs the voltage process until the second divided voltage V22 reaches 1V. Namely, the boosted voltage reaches 2V. When the boosted voltage is greater than 2V, the second divided voltage V22 is greater than 1V, such that the comparison unit 400 changes to output the low level signal, and then the boost unit 100 stops the voltage boost process and the boosted voltage V1 is maintained at 2V.

It should be noted that, the time slot of (t3–t2) is longer than a time slot for boosting the boosted voltage V1 from 1.5V to 2V.

6) At the time of t3, the third clock pulse signal EN3 is switched to the low level, such that the third NMOS transistor N3 is turned off; the fourth clock pulse signal EN4 is switched to the high level, such that the fourth NMOS transistor N4 is turned on; and the rest three clock pulse signals are unchanged, such that the rest three NMOS transistors are still being turned off. Therefore, the voltage division unit 200 outputs the fourth divided voltage V24. That is, the voltage division coefficient of the voltage division unit 200 is $2/6$. In other words, by controlling the clock pulse signals generated by the clock pulse generation units, the control unit 300 can control the corresponding NMOS transistors to be turned on or off, so as to achieve a purpose of switching the voltage division coefficient from $3/6$ to $2/6$. Because the voltage division coefficient is $2/6$ and the boosted voltage V1 is 2V, the second divided voltage V22 is $2/3$V at the moment. That is, the present divided voltage is lower than the reference voltage Vref. Therefore, the comparison unit 400 outputs the high level signal again, and then the boost unit 100 continues to perform the voltage boost process, so as to boost the boosted voltage V1 to a higher level on the basis of 2 V.

7) In the time slot of (t3, t4), all the clock pulse signals are unchanged, thus the boost unit 100 continuously performs the voltage process until the second divided voltage V22 reaches 1V. Namely, the boosted voltage reaches 3V. When the boosted voltage is greater than 3V, the second divided voltage V22 is greater than 1V, such that the comparison unit 400 changes to output the low level signal, and then the boost unit 100 stops the voltage boost process and the boosted voltage V1 is maintained at 3V.

It should be noted that, the time slot of (t4–t3) is longer than a time slot for boosting the boosted voltage V1 from 2V to 3V.

8) At the time of t4, the fourth clock pulse signal EN4 is switched to the low level, such that the fourth NMOS transistor N4 is turned off; the fifth clock pulse signal EN5 is switched to the high level, such that the fifth NMOS transistor N5 is turned on; and the rest three clock pulse signals are unchanged, such that the rest three NMOS transistors are still being turned off. Therefore, the voltage division unit 200 outputs the fifth divided voltage V25. That is, the voltage division coefficient of the voltage division unit 200 is $1/6$. In other words, by controlling the clock pulse signals generated by the clock pulse generation units, the control unit 300 can control the corresponding NMOS transistors to be turned on or off, so as to achieve a purpose of switching the voltage division coefficient from $2/6$ to $1/6$. Because the voltage division coefficient is $1/6$ and the boosted voltage V1 is 3V, the second divided voltage V22 is $1/2$V at the moment. That is, the present divided voltage is lower than the reference voltage Vref. Therefore, the comparison unit 400 outputs the high level signal again, and then the boost unit 100 continues to perform the voltage boost process, so as to boost the boosted voltage V1 to a higher level on the basis of 3V.

9) In the time slot of (t4, t5), all the clock pulse signals are unchanged, thus the boost unit 100 continuously performs the voltage process until the second divided voltage V22 reaches 1V. Namely, the boosted voltage reaches 6V. When the boosted voltage is greater than 6V, the second divided voltage V22 is greater than 1V, such that the comparison unit 400 changes to output the low level signal, and then the boost unit 100 stops the voltage boost process and the boosted voltage V1 is maintained at 6V.

It should be noted that, the time slot of (t5–t4) is longer than a time slot for boosting the boosted voltage V1 from 3V to 6V, and is corresponding to duration of the erase voltage.

It also should be noted that, the above durations of the boosted voltages may have a same length, or parts of them may have a same length, or none of them has a same length.

Figure 6:
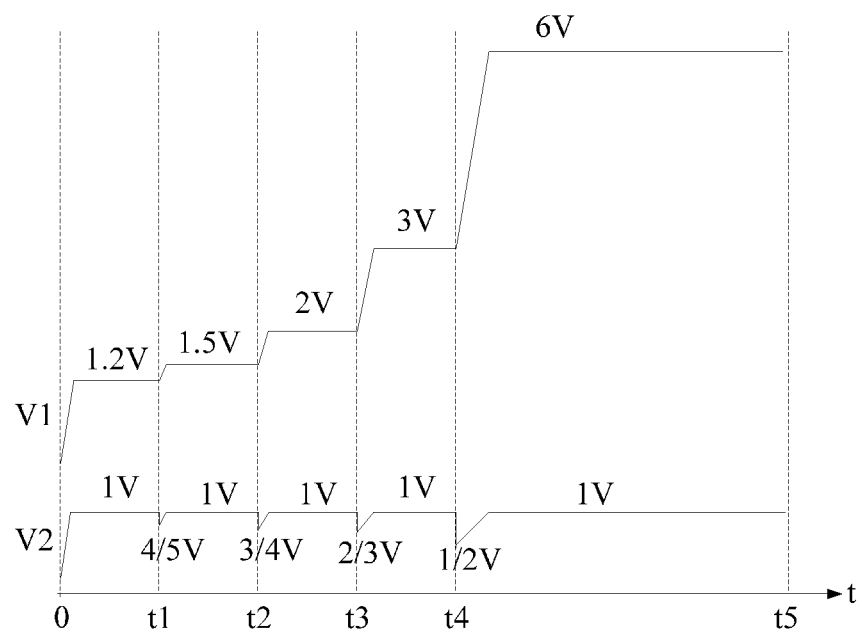
FIG. 6 schematically illustrates a timing diagram of a boosted voltage and a divided voltage according to one embodiment of the present disclosure.

From above, a diagram illustrating a relationship of the boosted voltage V1 with time, and a relationship of the divided voltage V2 with time is shown in FIG. 6. As the output voltage of the output unit 500 is the boosted voltage V1, a relationship of the operation voltage with time is the same as the relationship of the boosted voltage V1 with time shown in FIG. 6.

In this embodiment, the voltage divide unit corresponds to five voltage division coefficients. The control unit performs descending switching operation on all the voltage division coefficients; namely, the voltage division coefficients are switched from big to small, thus the boost process of the boosted voltage can be divided into five stages. Each stage includes two processes of boosting and maintaining, such that a process for the boosted voltage reaching the target voltage is slowed down, and damage to the storage unit is avoided. At the same time, the output voltage of the voltage boost unit is used as the target voltage, such that there is no difference between them, and a negative effect on device power consumption and performance, which is caused by threshold voltage variations in the working process, is eliminated.

It should be noted that, in other embodiments of the present disclosure, the switching operation may be performed on only parts of the voltage division coefficients by changing clock pulse signals provided by the control unit (namely, parts of the clock pulse signals are always a low level signal), so as to reduce establishing stages of the operation voltage.

In another embodiment of the present disclosure, the voltage division coefficients provided by the voltage division unit may be 1/6, 1/7, 1/8, 1/9, 1/10, 1/11 and 1/12, the operation voltage is an erase voltage, the target voltage is 12V, and the reference voltage is 1V. Then, at first, the control unit selects the voltage division coefficient of the voltage division unit to be 1/6, and the voltage boost unit performs the voltage boost process; when the divided voltage is greater than the reference voltage, the voltage boost unit stops the voltage boost process and the boosted voltage is maintained at 6V; after a time period, the control unit switches the voltage division coefficient to be 1/7, the divided voltage at this time is 6/7V and is less than the reference voltage, and the voltage boost unit continues to perform the voltage boost process on the basis of 6V; when the divided voltage is greater than the reference voltage, the voltage boost unit stops the voltage boost process and the boosted voltage is maintained at 7V; after a time period, the control unit switches the voltage division coefficient to be 1/8, the divided voltage at this time is 7/8V and is less than the reference voltage, and the voltage boost unit continues to perform the voltage boost process on the basis of 7V; when the divided voltage is greater than the reference voltage, the voltage boost unit stops the voltage boost process and the boosted voltage is maintained at 8V; after a time period, the control unit switches the voltage division coefficient to be 1/9, the divided voltage at this time is 8/9V and is less than the reference voltage, and the voltage boost unit continues to perform the voltage boost process on the basis of 8V; when the divided voltage is greater than the reference voltage, the voltage boost unit stops the voltage boost process and the boosted voltage is maintained at 9V; after a time period, the control unit switches the voltage division coefficient to be 1/10, the divided voltage at this time is 9/10V and is less than the reference voltage, and the voltage boost unit continues to perform the voltage boost process on the basis of 9V; when the divided voltage is greater than the reference voltage, the voltage boost unit stops the voltage boost process and the boosted voltage is maintained at 10V; after a time period, the control unit switches the voltage division coefficient to be 1/11, the divided voltage at this time is 10/11V and is less than the reference voltage, and the voltage boost unit continues to perform the voltage boost process on the basis of 10V; when the divided voltage is greater than the reference voltage, the voltage boost unit stops the voltage boost process and the boosted voltage is maintained at 11V; after a time period, the control unit switches the voltage division coefficient to be 1/12, the divided voltage at this time is 11/12V and is less than the reference voltage, and the voltage boost unit continues to perform the voltage boost process on the basis of 11V; when the divided voltage is greater than the reference voltage, the voltage boost unit stops the voltage boost process and the boosted voltage is maintained at 12V.

In the above embodiment, in view of there is no damage to the storage unit if the boosted voltage reaches 6V, the boosted voltage is directly boosted to a high value (that is, 6V). Then, the boosted voltage is slowly boosted in multiple stages. Hence, the boost time is reduced under a premise that the boost rate is effectively controlled.

Moreover, the boosted voltage may be uniformly boosted from 6V to 12V with a step of 1V, such that the boost process is further slowed down.

Correspondingly, a storage device is also provided in embodiments of the present disclosure. The storage device includes the above circuit for controlling operation voltage, so as to provide an erase voltage and other operation voltages.

Correspondingly, a method for controlling operation voltage is also provided in embodiment of the present disclosure. The method may include:

providing an initial voltage, and performing a voltage boost process on the initial voltage, so as to obtain a boosted voltage;

performing a voltage division process on the boosted voltage so as to obtain a divided voltage;

if the divided voltage is lower than a reference voltage, performing the voltage boost process continuously, and if the divided voltage is greater than the reference voltage, stopping the voltage boost process;

performing a switching process, where the switch process includes: after the voltage boost process is stopped for a period of time, reducing a voltage division coefficient of the voltage division process, such that the divided voltage is lower than the reference voltage and the voltage boost process is performed until the divided voltage is higher than the reference voltage and the voltage boost process is stopped; and;

repeating the switching process until the boosted voltage reaches a target voltage.

The above method can be implemented by the above circuit for controlling operation voltage, and is not described in detail herein.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A circuit for controlling operation voltage, comprising:
a voltage boost unit adapted for: if receiving a first signal, performing a voltage boost process so as to output a boosted voltage; and if receiving a second signal, stopping the voltage boost process and maintaining a value of the boosted voltage;
a voltage division unit adapted for performing a voltage division process on the boosted voltage so as to output a divided voltage, wherein the voltage division unit comprises a plurality of different voltage division coefficients;
a comparison unit adapted for: comparing the divided voltage with a reference voltage; if the divided voltage is lower than the reference voltage, outputting the first signal; and if the divided voltage is higher than the reference voltage, outputting the second signal;
a control unit adapted for performing a descending switching operation on at least parts of the plurality of voltage division coefficients until the boosted voltage reaches a target voltage; and
an output unit adapted for outputting the boosted voltage.

2. The circuit for controlling operation voltage according to claim 1, wherein the voltage boost unit is a charge pump.

3. The circuit for controlling operation voltage according to claim 1, wherein the voltage division unit is implemented in a resistor division mode, a capacitance division mode, or a transistor division mode.

4. The circuit for controlling operation voltage according to claim 1, wherein the voltage division unit comprises a plurality of output terminals, a number of the plurality of output terminals is equal to a number of the plurality of voltage division coefficients, and the plurality of output terminals are corresponding to the plurality of voltage division coefficients respectively.

5. The circuit for controlling operation voltage according to claim 4, wherein the control unit comprises a plurality of control subunits, a number of the plurality of control subunits is equal to the number of the plurality of voltage division coefficients, and each of the plurality of control subunits comprises a clock pulse generation unit and a switch, and wherein a first terminal of the switch is connected with an output terminal of the voltage division unit, a second terminal of the switch is connected with an input terminal of the voltage division unit, and the clock pulse generation unit is adapted for generating a clock pulse signal to control the switch to be turned on or off.

6. The circuit for controlling operation voltage according to claim 5, wherein the switch is an NMOS transistor, a source of the NMOS transistor is connected with the voltage division unit, a drain of the NMOS transistor is connected with the comparison unit, and a gate of the NMOS transistor is connected with the clock pulse generation unit.

7. The circuit for controlling operation voltage according to claim 5, wherein the clock pulse generation unit comprises a decoding circuit and a NOR gate, the decoding unit is connected with a first input terminal of the NOR gate, a second input terminal of the NOR gate is adapted for receiving a low level signal, and an output terminal of the NOR gate is connected with the switch.

8. The circuit for controlling operation voltage according to claim 1, wherein the first signal is a high level signal, and the second signal is a low level signal.

9. A storage device, comprising: a circuit for controlling operation voltage, wherein the circuit for controlling operation voltage comprises:

a voltage boost unit adapted for: if receiving a first signal, performing a voltage boost process so as to output a boosted voltage; and if receiving a second signal, stopping the voltage boost process and maintaining a value of the boosted voltage;

a voltage division unit adapted for performing a voltage division process on the boosted voltage so as to output a divided voltage, wherein the voltage division unit comprises a plurality of different voltage division coefficients;

a comparison unit adapted for: comparing the divided voltage with a reference voltage; if the divided voltage is lower than the reference voltage, outputting the first signal; and if the divided voltage is higher than the reference voltage, outputting the second signal;

a control unit adapted for performing a descending switching operation on at least parts of the plurality of voltage division coefficients until the boosted voltage reaches a target voltage; and an output unit adapted for outputting the boosted voltage.

10. The storage device according to claim 9, wherein the voltage boost unit is a charge pump.

11. The storage device according to claim 9, wherein the voltage division unit is implemented in a resistor division mode, a capacitance division mode, or a transistor division mode.

12. The storage device according to claim 9, wherein the voltage division unit comprises a plurality of output terminals, a number of the plurality of output terminals is equal to a number of the plurality of voltage division coefficients, and the plurality of output terminals are corresponding to the plurality of voltage division coefficients respectively.

13. The storage device according to claim 12, wherein the control unit comprises a plurality of control subunits, a number of the plurality of control subunits is equal to the number of the plurality of voltage division coefficients, and each of the plurality of control subunits comprises a clock pulse generation unit and a switch, and wherein a first terminal of the switch is connected with an output terminal of the voltage division unit, a second terminal of the switch is connected with an input terminal of the voltage division unit, and the clock pulse generation unit is adapted for generating a clock pulse signal to control the switch to be turned on or off.

14. The storage device according to claim 13, wherein the switch is an NMOS transistor, a source of the NMOS transistor is connected with the voltage division unit, a drain of the NMOS transistor is connected with the comparison unit, and a gate of the NMOS transistor is connected with the clock pulse generation unit.

15. The storage device according to claim 13, wherein the clock pulse generation unit comprises a decoding circuit and a NOR gate, the decoding unit is connected with a first input terminal of the NOR gate, a second input terminal of the NOR gate is adapted for receiving a low level signal, and an output terminal of the NOR gate is connected with the switch.

16. The storage device according to claim 9, wherein the first signal is a high level signal, and the second signal is a low level signal.

17. A method for controlling operation voltage, comprising:

providing an initial voltage, and performing a voltage boost process on the initial voltage so as to obtain a boosted voltage;

performing a voltage division process on the boosted voltage so as to obtain a divided voltage;

if the divided voltage is lower than a reference voltage, performing the voltage boost process continuously, and if the divided voltage is higher than the reference voltage, stopping the voltage boost process;

performing a switching process, where the switch process comprises: after the voltage boost process is stopped for a period of time, reducing a voltage division coefficient of the voltage boost process, such that the divided voltage is lower than the reference voltage and the voltage boost process is performed until the divided voltage is higher than the reference voltage and the voltage boost process is stopped; and repeating the switching process until the boosted voltage reaches a target voltage.

* * * * *